US005245664A

United States Patent [19]

Kinoshite et al.

[11] Patent Number: 5,245,664

[45] Date of Patent: Sep. 14, 1993

[54] ACTIVE NOISE CONTROL SYSTEM FOR AUTOMOTIVE VEHICLE

[75] Inventors: Akio Kinoshite; Hirofumi Aoki, both of Kanagawa, Japan

[73] Assignee: Nissan Motor Company, Limited, Japan

[21] Appl. No.: 629,637

[22] Filed: Dec. 21, 1990

[30] Foreign Application Priority Data

Dec. 29, 1989 [JP] Japan ................................ 1-341909

[51] Int. Cl.$^5$ ............................................ H03B 29/00

[52] U.S. Cl. ............................................ 381/71

[58] Field of Search ................................ 381/71

[56] References Cited

U.S. PATENT DOCUMENTS

| | | | |
|---|---|---|---|
| 4,025,724 | 5/1977 | Davidson, Jr. et al. | 381/71 |
| 4,069,395 | 1/1978 | Nash . | |
| 4,506,380 | 3/1985 | Matsui | 381/71 |
| 4,562,289 | 12/1985 | Warnaka et al. | 381/71 |
| 4,669,122 | 5/1987 | Swinbanks | 381/71 |
| 5,018,202 | 5/1991 | Takahashi et al. | 381/71 |

FOREIGN PATENT DOCUMENTS

| | | |
|---|---|---|
| 0098594 | 7/1983 | European Pat. Off. . |
| 3344910 | of 1983 | Fed. Rep. of Germany . |
| 2104754 | 6/1982 | United Kingdom . |
| 2126837 | 8/1983 | United Kingdom . |
| 2130651 | 11/1983 | United Kingdom . |
| 2132053 | 12/1983 | United Kingdom . |

OTHER PUBLICATIONS

"Counteracting Undesirable Noise Within Motor Vehicles", Design Engineering (Sep. 1990), pp. 49-54.

*Primary Examiner*—Jin F. Ng
*Assistant Examiner*—Nina Tong
*Attorney, Agent, or Firm*—Lowe, Price, LeBlanc & Becker

[57] ABSTRACT

An active noise control system includes a plurality of vibration pickups for detecting of physical quantities of noise sources, such as vibrations of suspension members of a vehicle, and a plurality of microphones for detecting residual noises transmitted to observing positions. The output signals of the vibration pickups are added up by means of an adder to be input to a controller. The active noise control system also includes a plurality of delay circuits for applying delay times to the respective output signals of the vibration pickups so as to essentially equalize transmitting time of one of the output signals with that of the other output signals. The output signals of the microphones are input to the controller independently of each other. The controller outputs drive signals to a plurality of loudspeakers independent of each other to cause the loudspeakers to produce control sounds so that the control sounds interfere with the noises transmitted from the noise sources to decrease the noises transmitted to the observing positions.

17 Claims, 4 Drawing Sheets

$$E \propto \oint_S \vec{f}\,dS$$

ACTIVE NOISE CONTROL SYSTEM FOR AUTOMOTIVE VEHICLE

BACKGROUND OF THE INVENTION

1. Field of the Invention

The present invention relates generally to an active noise control system for causing noises produced from a noise source to interfere with a control sound so as to decrease the noise. More specifically, the invention relates to an active noise control system which can be applied to decrease noises in a passenger cabin of an automotive vehicle, an airplane and so forth.

2. Description of The Background Art

One of active noise control systems of this type has been disclosed in British Patent First (unexamined) Publication No. 2149614.

This conventional system may be applied to a closed space, such as a passenger cabin of an airplane, and may operate only under a condition in that a single noise source (a primary sound source), such as an engine arranged outside the closed space, produces sounds including a fundamental blade frequency $f_0$ and higher harmonic waves $f_1$ to $f_n$. To be concrete, this conventional system comprises a plurality of loudspeakers (secondary sound sources) and microphones arranged within the closed space; frequency detecting means for detecting frequencies $f_0$ to $f_n$ of noise sources; and a signal processor for supplying signals having opposite phases to the detected frequencies $f_0$ to $f_4$, to the loudspeakers on the basis of the output signals of the microphones and the detected signals of the frequency detecting means. With this construction, this conventional system can minimize the sound pressure level within the closed space by causing the secondary sounds produced from the loudspeakers to interfere with the primary sound transmitted from the noise sources.

However, since the aforementioned conventional active noise control system is designed to decrease noises within the closed space produced from a single noise source (a primary sound source), there is a disadvantage in that, for example, when noises are transmitted from a plurality of noise sources at the same time, any one of the noise sources must be selected as the detected object of the frequency detecting means, so that the system can not effectively decrease the noises from the plurality of noise sources. In addition, if a plurality of the aforementioned conventional systems are provided for a plurality of noise sources and are designed to operate independently of each other, there is a disadvantage in that the system becomes expensive and cannot effectively control sound reduction since the number of operational elements is limited.

SUMMARY OF THE INVENTION

It is therefore a principal object of the present invention to provide an active noise control system which can decrease noises produced from a plurality of noise sources by means of a simple controller by using only a few of noise source detecting signals.

In order to accomplish the aforementioned and other objects, an active noise control system for decreasing noises transmitted to an observing position from a plurality of independent noise sources comprises: a plurality of noise source detecting means for monitoring physical quantities of individual noise sources to produce first signals indicative of the physical quantities of the noise source; signal collecting means for collecting the first signals to produce a second additive signal indicative of the sum of the first signals; residual noise detecting means for monitoring a residual noise transmitted to the observing position, to produce a third signal indicative of the residual noise; sound source means, arranged at a location neighboring the observing position, for producing a control sound to cause the noises transmitted from the noise sources to interfere with the control sound so as to decrease the noises transmitted to the observing position; and control means for receiving the second and third signals to produce a fourth signal for driving the sound source means on the basis of the second and third signals.

According to another aspect of the present invention, an active noise control system for decreasing noises transmitted to an observing position from a plurality of independent noise sources, comprises: a plurality of noise source detecting means for monitoring physical quantities of individual noise sources to produce first signals indicative of the physical quantities of the noise source; signal collecting means for collecting the first signals to produce a second signal indicative of the sum of the first signals; delay circuit means for applying delay times to the respective first signals so as to essentially equalize the transmitting times of the first signals to the signal collecting means; residual noise detecting means for monitoring a residual noise transmitted to the observing position, to produce a third signal indicative of the residual noise; sound source means, arranged at a location neighboring the observing position, for producing a control sound to cause the noises transmitted from the noise sources to interfere with the control sound so as to decrease the noises transmitted to the observing position; and control means for receiving the second and third signals to produce a fourth signal for driving the sound source means on the basis of the second and third signals.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Figure 1:
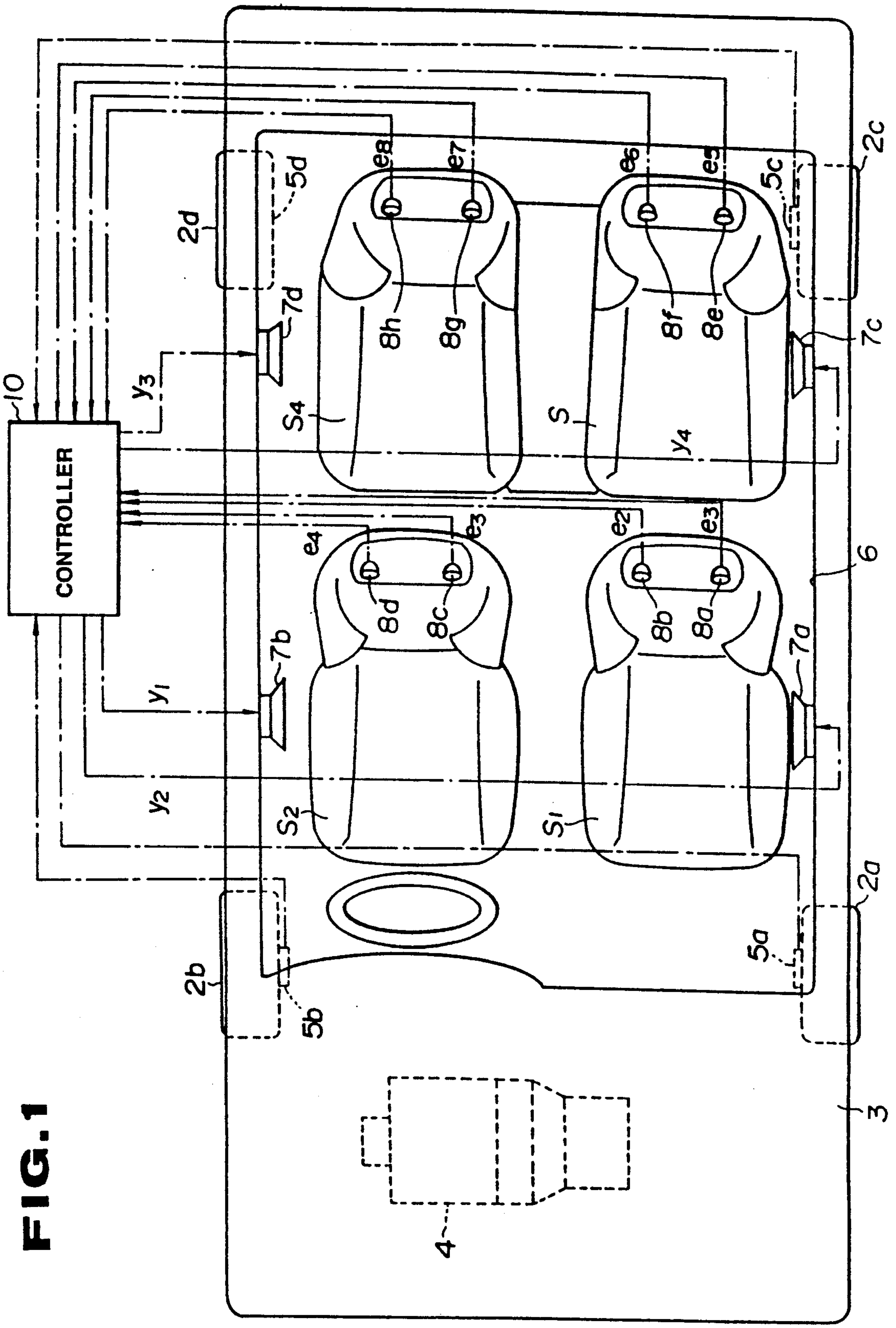
FIG. 1 is a schematic view of the first preferred embodiment of an active noise control system, according to the present invention.

Referring now to the drawings, particularly to FIG. 1, there is schematically shown the first preferred embodiment of an active noise control system, according to the present invention, which can be applied to so-called front engine/front drive vehicle.

As shown in FIG. 1, a vehicular body 3 is supported on front and rear wheels 2*a* to 2*d* via suspension members. The front wheels 2*a* and 2*b* are driven to rotate by means of an engine 4 mounted on the front portion of the vehicular body 3.

Vibration pickups 5*a* to 5*d* are mounted on the suspension members suspending the wheels 2*a* to 2*d* at a predetermined location, respectively. The vibration pickups 5*a* to 5*d* comprise, for example, acceleration sensors. The vibration pickups 5*a* to 5*d* are designed to output electrical signals $X_1$ to $X_4$ which correspond to vibrations of the suspensions due to irregularities of road. These electrical signals $X_1$ to $X_4$ will be hereinlater referred to as "road-noise detection signals".

In a vehicular compartment 6 serving as an acoustic space, loudspeakers 7*a* to 7*d* are mounted on door portions facing front and rear seats $S_1$ to $S_4$, respectively. The loudspeakers 7*a* to 7*d* serve as control sound sources for outputting audio signals. In addition, microphones 8*a* to 8*h* are mounted on head rest portions of the respective seats $S_1$ to $S_4$. The microphones 8*a* to 8*h* serve as residual-noise detecting means for outputting electrical signals $e_1$ to $e_8$ which correspond to sound pressures input thereto. These electrical signals $e_1$ to $e_8$ will be hereinlater referred to as "residual-noise detection signals".

A controller 10 receives the detecting signals which are output from the vibration pickups 5*a* to 5*d* and the microphones 8*a* to 8*h* independently of each other, and outputs drive signals $Y_1$ to $Y_4$ to the loudspeakers 7*a* to 7*d* independently of each other, so as to cause these loudspeakers 7*a* to 7*d* to output acoustic signals (control sounds) to the interior of the vehicular compartment 6.

Figure 2:
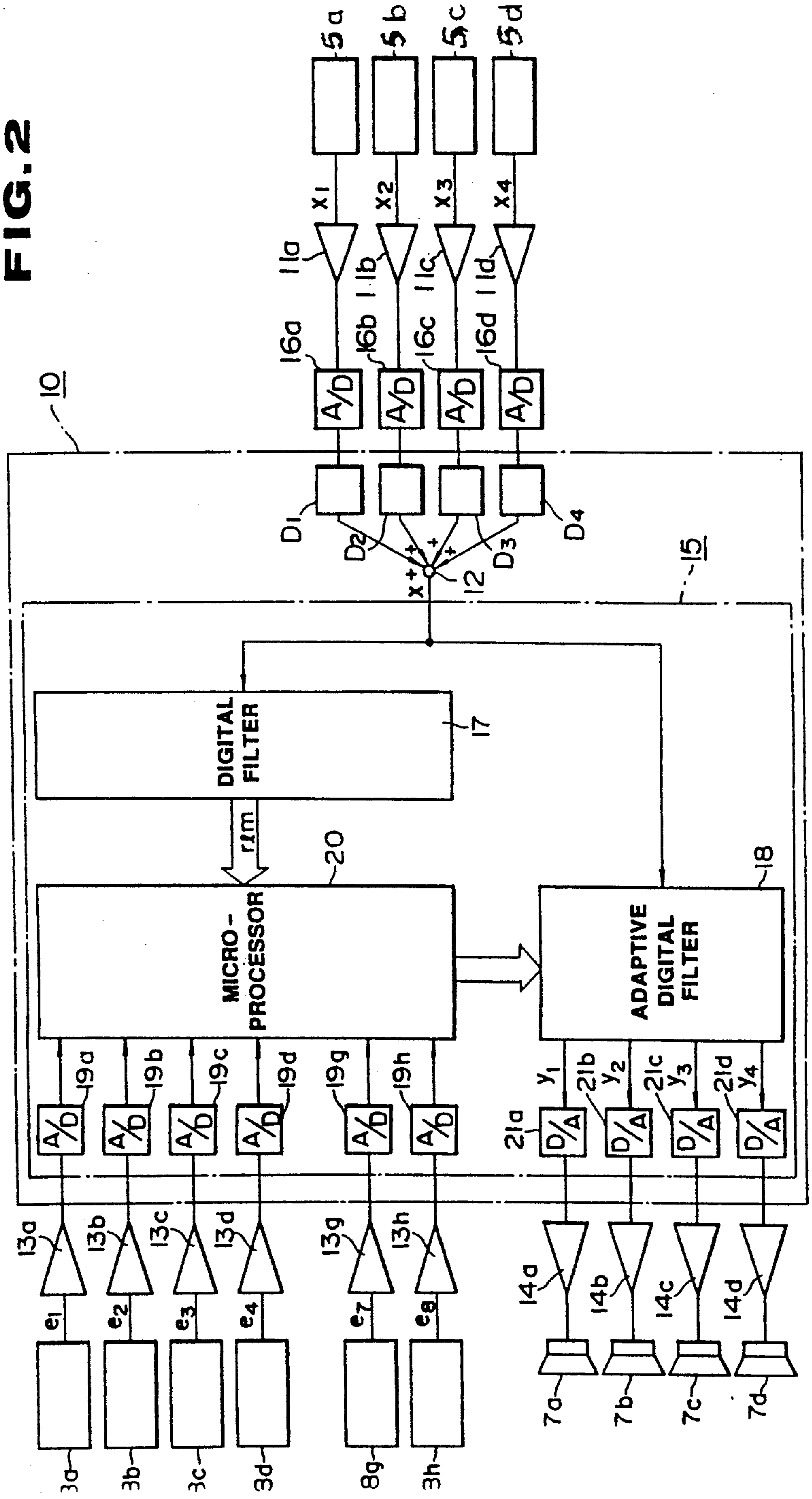
FIG. 2 is a block diagram of a controller which can be applied to the first preferred embodiment of the active noise control system of FIG. 1.

As shown in FIG. 2, the controller 10 generally comprises an adder 12 and a processor unit 15. The adder 12 is designed to receive road-noise detection signals $X_1$ to $X_4$ which are output from the vibration pickups 5*a* to 5*d* via amplifiers 11*a* to 11*d*. The processor unit 15 is designed to receive an add signal output from adder 12. This add signal serves as a reference signal X. The processor is also designed to receive the residual-noise detection signals $e_1$ to $e_8$ from the microphones 8*a* to 8*h* via amplifiers 13*a* to 13*h*, and to output the drive signals $y_1$ to $y_4$ via amplifiers 14*a* to 14*d*. The roadnoise detection signals $X_1$ to $X_4$ are input to the adder 12 via delay circuits $D_1$ to $D_4$ so that all of control sounds reach a sound receiving point at the same time. For example, assuming that the sound receiving point is the position of the driver's ear, delay times of sound propagation between the respective vibration pickups 5*a* to 5*d* and the sound receiving point (the position of the driver's ear) are previously measured. If the sound propagating route from the vibration pickup 5*c* has the maximum delay time $\Delta t_{MAX}$, i.e. if the propagating time of the road-noise detection signal $X_3$ is the maximum delay time $\Delta t_{MAX}$, time lags of the maximum delay time $\Delta t_{MAX}$ from the respective delay times $\Delta t_1$, $\Delta t_2$ and $\Delta t_4$ in the propagation routes of the vibration pickups 5*a*, 5*b* and 5*d*, are applied to the road-noise detection signals $X_1$, $X_2$ and $X_4$ by means of the delay circuits $D_1$ to $D_4$ so that all of control sounds reach the sound receiving point at the same time.

The processor unit 15 comprises a digital filter 17 and an adaptive digital filter 18 to which the digital reference signal X output from the adder 12 is input; A/D converters 19*a* to 19*h* serving to perform analog-to-digital conversions of the residual-noise detection signals $e_1$ to $e_8$ which are output from the microphones 8*a* to 8*h* to be amplified by means of the amplifiers 13*a* to 13*h*; a microprocessor 20 to which the converted signals of the A/D converters 19*a* to 19*h* and the output signal of the digital filter 17 are input; and D/A converters 21*a* to 21*d* serving to perform digital-to-analog conversion of the drive signals $Y_1$ to $Y_4$ which are output from the adaptive digital filter 18.

The digital filter 17 is designed to receive the reference signal X to produce a filter processed reference signal $r_{lm}$ in accordance with the number of combination of the propagation functions between the microphones and the speakers (see equations (4) and (5) which will be described hereinlater). The adaptive digital filter 18 has separated filters, the number of which corresponds to the number of output channels to the speakers 7*a* to 7*d*. The adaptive digital filter 18 is designed to receive the reference signal X to perform adaptive signal processing on the basis of the filter factor set at this time, to output the speaker drive signals $Y_1$ to $Y_4$. The microprocessor 20 is designed to receive the residual-noise detection signals $e_1$ to $e_8$ and the filter processed reference signal $r_{lm}$ to change the filter factor of the adaptive digital filter 18 by using LMS algorithm.

By using general formulae, the control principle of the processor unit 15 is described below with reference to the following equation;

$$e_l(n) = e_{pl}(n) + \sum_{m=1}^{M} \sum_{j=0}^{Ic-1} C_{lmj} \cdot \left\{ \sum_{i=0}^{Ik-1} W_{mi} \cdot X(n-j-i) \right\} \quad (1)$$

Now, assuming that the residual-noise detection signal detected by a microphone 1 (one of microphones 8*a* to 8*h*) is $e_1(n)$, and that the residual-noise detection signal detected by the microphone 1 is $e_{pl}(n)$ when the loudspeakers 7*a* to 7*d* produce no control sound (secondary sound), and assuming the filter factor corresponding to j ($j=0, 1, 2, \ldots, I_c-1$) of the propagation function FIR (finite impulse response) function) $H_{lm}$ between loudspeaker m (one of the loudspeakers 7*a* to 7*d*) and the microphone 1 is $C_{lmi}$, the reference signal is X(n), and that a factor i ($i=0, 1, 2, \ldots, I_k-1$) of the adaptive filter 17 which receives the reference signal X(n) to drive the number m loudspeaker 7*a* to 7*d* is $W_{mi}$, the above equation may be established in which all the terms having (n) are sampled-data at the sampling time n, L being the number of microphones 8*a* to 8*h* (8 in this embodiment), M being the number of the loudspeakers 7*a* to 7*d* (4 in this embodiment), $I_c$ being the maximum filter factor expressed by the FIR digital filter, and $I_k$ being the maximum value of the adaptive filter $W_m$.

In the right side of the aforementioned equation (1), the term $\{\Sigma W_{mi} \cdot X(n-j-i)\}$ expresses the output when the reference signal X is input to the adaptive digital filter 18, and the term $\Sigma C_{lmj} \cdot \{\Sigma W_{mi} \cdot X(n-j-i)\}$ expresses the signal when the signal energy input to one of the speakers 7a to 7d is output to the vehicular compartment 6 as acoustic energy to reach microphone 1 via the propagation function $H_{lm}$. In addition, all the right side of the aforementioned equation (1) expresses the total of the secondary sounds which reach microphone 1, since the signals of all the speakers may cumulatively be input to the microphone 1.

Next, an evaluation function Je is assumed as follows.

$$Je = \sum_{l=1}^{L} \{e_l(n)\}^2 \quad (2)$$

In order to obtain a filter factor $W_m$ by which the evaluation function Je becomes minimum, the steepest descent method is used in this embodiment. That is, the filter factor $W_{mi}$ is renewed by a value which is obtained by partially differentiating the evaluation function Je with respect to the respective filter factors $W_{mi}$.

Therefore, from the equation (2), the following equation may be obtained.

$$\frac{\partial Je}{\partial W_{mi}} = \sum_{l=1}^{L} 2 \cdot e_l(n) \cdot \frac{\partial e_l(n)}{\partial W_{mi}} \quad (3)$$

However, from the equation (1), the following equation may be obtained.

$$\frac{\partial e_l(n)}{\partial W_{mi}} = \sum_{j=0}^{Ic-1} C_{lmj} \cdot X(n - j - i) \quad (4)$$

Therefore, if the right side of the equation (4) is assumed to be $r_{lm}(n-i)$, the equation for rewriting the filter factor becomes as follows.

$$W_{mi}(n + 1) = W_{mi}(n) + \alpha \cdot \sum_{l=1}^{L} \gamma_l \cdot e_l(n) \cdot r_{lm}(n - i) \quad (5)$$

in which $\alpha$ is a convergence factor which is related to a speed at which the filter converges under optimum condition and to the stability thereof, and $\gamma_l$ is a weighting factor. Furthermore, although the convergence factor $\alpha$ is a constant in this embodiment, convergence factors $\alpha_{mi}$ which are different at every filter factor may be substituted for the convergence factor $\alpha$, and a factor $\alpha_l$ including the weight factor $\gamma_l$ may be also substituted for the convergence factor $\alpha$.

In this way, by renewing the filter factor $W_{mi}(n+1)$ of the adaptive digital filter 18 in accordance with the LMS (Least Mean Square) adaptive algorithm on the basis of the residual-noise detection signals $e_1(n)$ to $e_8(n)$ which are output from the microphones 8a to 8h and on the basis of the reference signal X(n) derived from the outputs of the respective vibration pickups 5a to 5d, the drive signals $Y_1(n)$ to $Y_4$ for always minimizing the input residual-noise detection signals $e_1(n)$ to $e_8(n)$ are formed. These drive signals $Y_1(n)$ to $Y_4$ are input to the loudspeakers 7a to 7d, so that noises, such as road noises transmitted to the interior of the vehicular compartment 6, can be removed by means of control sounds which are output from the loudspeakers 7a to 7d.

The operation of the first preferred embodiment of an active noise control system, according to the present invention, is described below.

When the automotive vehicle is running on a road, if the road has irregularities, the suspension members vibrate, so that the vibration pickups 5a to 5d output road-noise detection signals $X_1$ to $X_4$ corresponding to vibrations of the suspension members. These road-noise detection signals $X_1$ to $X_4$ are amplified by means of the amplifiers 11a to 11d, and converted from analog to digital by means of the A/D converters 16a to 16d to be input to the controller 10. Then, the converted signals are delayed by means of the delay circuits $D_1$ to $D_4$, and added up by means of the adder 12 to be output as a reference signal X(n). This reference signal X(n) can be expressed by the following equation.

$$X(n) = \sum_{i=1}^{L} \beta_i X_i(n - N_i) \quad (6)$$

in which $\beta_i$ is a weighting factor used for correcting the respective outputs of the vibration pickups 5a to 5d when there is remarkable difference between the respective outputs or when there is difference between proportions that the respective noise sources contribute to the noise; and $N_i$ is a delay time of each of the delay circuits $D_1$ and $D_4$ for adjusting the differences between the signal propagation times for which the signal propagates from the respective vibration pickups 5a to 5d to the sound receiving point, e.g. to the driver's seat.

The reference signal X produced in the aforementioned manner is transmitted to the processor unit 15. In this processor unit 15, the reference signal X input thereto is supplied to the digital filter 17 and the adaptive digital filter 18. The digital filter 17 outputs the filter processed reference signal $r_{lm}$ which is used in the equation (4). The filter processed reference signal $r_{lm}$ is derived from the reference signal X in accordance with the filter factor $C_{lm}$ which depends upon the propagation function between the microphones and the speakers.

On the other hand, the microphones 8a to 8h detect residual sounds at their positions (at the observing positions), and output the residual-noise detection signals $e_1$ to $e_8$ in accordance with their sound pressures. The residual-noise detection signals $e_1$ to $e_8$ are amplified by means of the amplifiers 13a to 13h to be input to the controller 10. The residual-noise detection signals $e_1$ to $e_8$ input to the controller 10 are converted to digital by means of the A/D converters 19a to 19h to be input to the microprocessor 20 of the processor unit 15.

The microprocessor 20 renews the filter factor by using the respective input signals on the basis of the equation (5). That is, the filter factor $W_{mi}(n+1)$ to be set at the sampling time (n+1) can be obtained from the filter factor $W_{mi}(n)$ at the current sampling time n, by deriving the filter factor at every filter when the evaluation function, i.e. total of square of the residual-noise detection signals $e_1(n)$ corresponding to the residual sound pressures from respective microphones 8a to 8h, become minimum. Then, the microprocessor 20 outputs control signals corresponding to the derived values $W_{mi}(n+1)$ to the adaptive digital filter 18. Therefore, the filter factors of the respective filters in the adaptive digital filter 18 are renewed to the newly derived filter factor $W_{mi}$. In this way, the microprocessor 20 repeatedly outputs commands for renewing the filter factor at every predetermined sampling time so as to minimize the evaluation function Je.

Accordingly, the output values $Y_m$ of the respective filters in the adaptive digital filter 18 are derived by performing vector analysis of the input reference signal X and the factors $W_{mi}$ on the basis of the current set filter factor. The derived output values $Y_m$ serve as drive signals to be output from the adaptive digital filter 18 to the loudspeakers 7a to 7d via the D/A converters 21a to 21d.

Then, the loudspeakers 7a to 7d produce control sounds (secondary sounds) corresponding to the input signals $Y_m$, so that the generated acoustic outputs propagate in the vehicular compartment space in accordance with the preset propagation functions $C_{1m}$ on the basis of directivities of the speakers, to form a sound field. Therefore, after convergence control is performed, the road noises which are transmitted to the eight observing points (the microphone setting positions) and their neighboring points, interfere with the control sounds to be nearly canceled, so that residual noises can be remarkably decreased.

In this way, in the aforementioned embodiment, noises transmitted from a plurality of independent noise sources (suspension members) are detected by means of the vibration pickups 5a to 5d serving as noise source detecting means, so that the road-noise detection signals $X_1$ to $X_4$ are added up by means of the adder 12, and the added output signal serves as one reference signal X to be input to the controller 10 serving as control means. Therefore, it is not required that the controller 10 individually performs noise decreasing processing with respect to the respective road-noise detection signals $X_1$ to $X_4$, so that the processing time can be decreased. As a result, the preferred embodiment of an active noise control system, according to the present invention, can be applied to a low-processing-speed microprocessor, and can effect wide-ranging noise-decrease at a low cost.

In addition, in the aforementioned embodiment, the delay times $\Delta t_1$ to $\Delta t_4$ derived on the basis of the maximum delay time $\Delta t_{MAX}$ are applied to the respective road noise detection signals $X_1$ to $X_4$ by means of the delay circuits $D_1$ to $D_4$. Therefore, the time lags when the respective road noises reach the sound receiving point, can be removed from the reference signals X(n), and it is possible to surely decrease noises by applying control sounds at the sound receiving point.

Figure 3:
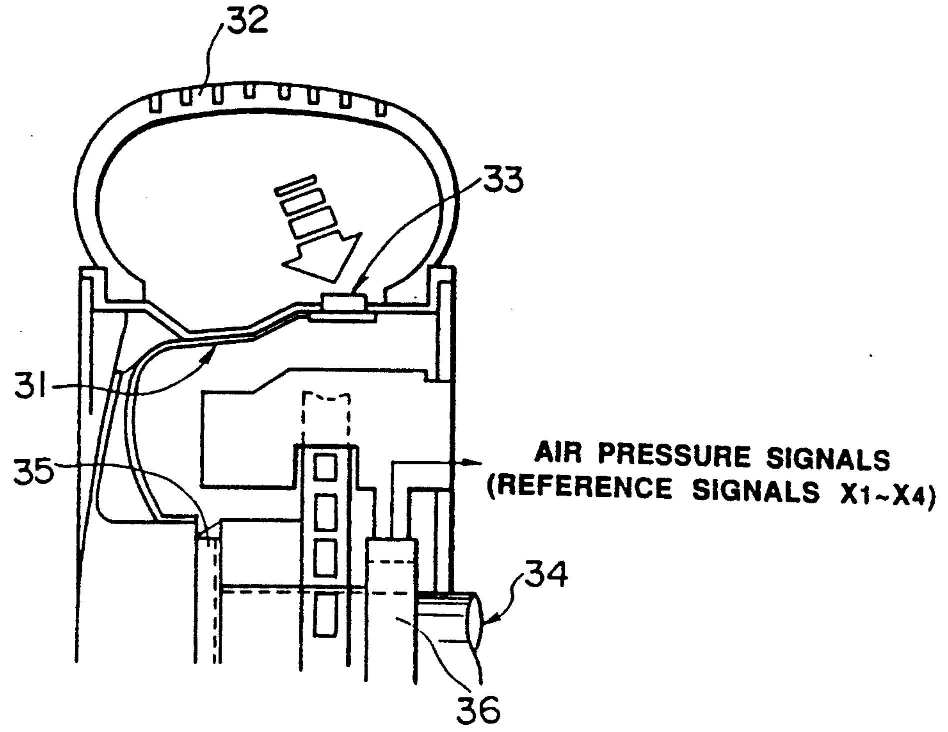
FIG. 3 is a sectional view showing a modification of noise source detecting means which can be applied to the first preferred embodiment of the active noise control system of FIG. 1.

Furthermore, in the aforementioned embodiment, although the vibration pickups 5a to 5d are mounted on the suspension members to serve as noise source detecting means for detecting signals or physical quantities related to the road noises, it should be appreciated that the other noise source detecting means can be used. For example, as shown in FIG. 3, an air-pressure sensor 33 made of a piezoelectric device or the like can be used as noise source detecting means. In this case, the air pressure sensor 33 may detect air pressure in the tire 32 arranged on the outer periphery of the tire wheel 31, and output air-pressure detection signals to the adder 12 of the controller 10 via a connector 35 mounted on a drive shaft 34 and via a spring ring 36 for use as the road-noise detection signals $X_1$ to $X_4$.

In addition, in the aforementioned embodiment, although the road noise sources are used as the noise source, it should be appreciated that other noise sources can be used. For example, revolution detection signals which are related to engine noise occurring in accordance with the revolution speed of the engine and or noises of a power transmission, a differential gear and so forth, can be input to the adder 12 as a reference signal X so as to have such noises compensated by the system of the invention.

Figure 4:
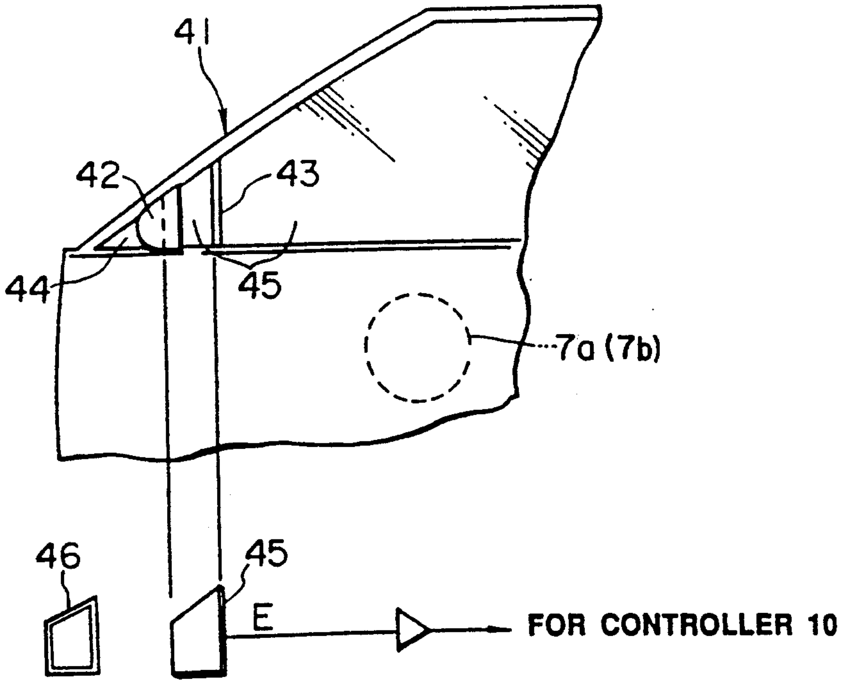
FIG. 4 is a schematic view of the second preferred embodiment of an active noise control system, according to the present invention.
Figure 5:
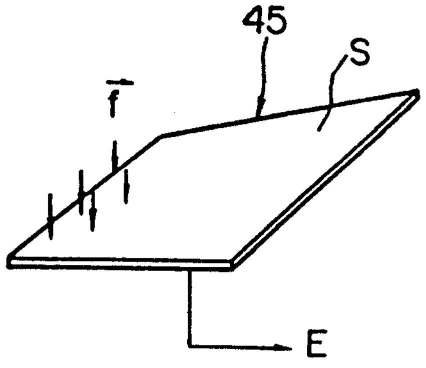
FIG. 5 is a perspective view of a pressure sensor which can be applied to the active noise control system of FIG. 4, which is explanatory of operation of the second preferred embodiment of the active noise control system of FIG. 4.

FIGS. 4 and 5 show the second preferred embodiment of an active noise control system, according to the present invention.

This embodiment is designed to decrease noises produced by a vehicle which is running through the air (wind noises). Generally, when a vehicle is running at speeds higher than 100 km/h, wind noises occur due to air blowing against the outer surface of the vehicular body. It has been found by the inventors of the present application that such wind noises occur mainly due to air eddying downstream of a body protrusion, for example a door mirror, which produces pressure fluctuations on the surface of the vehicular body. In a case where active control of this wind noise is performed, signals related to the pressure fluctuation phenomenon must be obtained as a reference signal. However, in such a pressure fluctuation phenomenon, the sound sources are located in wide space, and there is no relationship between pressure fluctuations at various local fields. For that reason, it is difficult to obtain signals related to all of the pressure fluctuations.

Therefore, in the second preferred embodiment of the invention, as shown in FIG. 4, a pair of vertically extending frame members 43 are respectively mounted on the doors 41 of the vehicular body 3 behind the mounting portions of the door mirrors 42, and trapezoid pressure sensors 45 made of a piezoelectric device formed as a plate or film, are respectively mounted on the outer surfaces of triangular regions 44 defined by the frame members 43. A pair of frame members 46 made of a resin or the like are mounted on the triangular region 44, and the pressure sensors 45 are secured to the frame members 46. Alternatively, the pressure sensors 45 may be adhered to plate members, which are respectively made of iron or the like and mounted on the triangular regions 44, so as to be resiliently fixed to the triangular regions 44. In addition, the loudspeakers 7a and 7b (left and right side of vehicle respectively) are arranged nearer the vehicular passengers than the pressure sensors 45 as shown by the dotted line in FIG. 4.

The operation of the second preferred embodiment of an active noise control system, according to the present invention, is described below.

Since the pressure sensors 45 are made of plate-form piezoelectric devices having a relatively wide area, the piezoelectric devices can produce electric charges in accordance with pressures. When the output (quantity of charge) of the pressure sensor 45 is assumed as E, a quantity of charge may be obtained by integrating a force $\vec{f}$ fluctuating at every local field over area as follows.

$$E \propto \oint_s \vec{f}\, ds.$$

Therefore, independent pressure fluctuation signals can be added up in the pressure sensor 45, so that the pressure sensor 45 may serve as both of noise source detecting means and signal collecting means. The output of this pressure sensor 45 is input to the A/D converter 16 of the processor unit 15 as shown in FIG. 1, so that the wind noises can be decreased by performing the active noise control.

When the size of the pressure sensor is greater than or equal to the size of the air flow eddy and the distance between the air flow eddies, information for the pressure fluctuation can be effectively and continuously detected.

Figure 6:
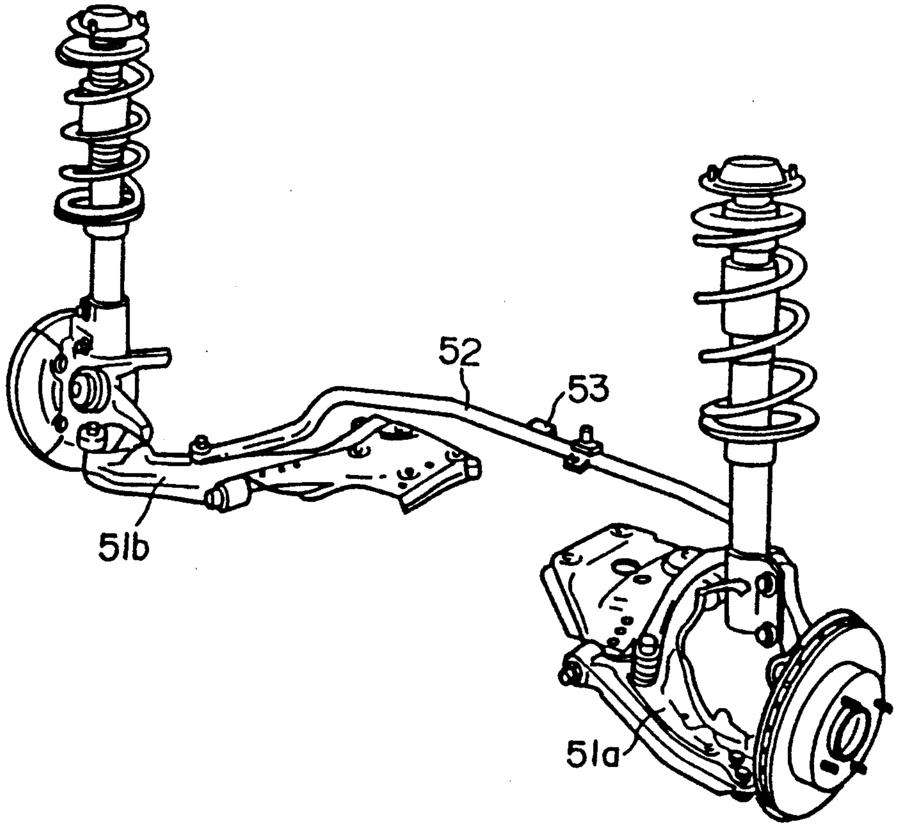
FIG. 6 is a perspective view of the third preferred embodiment of an active noise control system, according to the present invention.

FIG. 6 shows the third preferred embodiment of an active noise control system, according to the present invention.

In this embodiment, in order to input road noises from the respective wheels, a vibration pickup is mounted on a connecting member which mechanically connects right and left suspension members to each other, to add at least two independent road noises so as to obtain a road-noise detection signal.

That is, as shown in FIG. 6, a stabilizer 52 for restraining the vehicular body from rolling extends between right and left suspension members 51*a* and 51*b* at both front and rear of the vehicle. A vibration pickup 53 is mounted on each stabilizer 52 essentially at the center thereof. The vibration pickups 53 output a road-noise detection signal in which vibrations of the right and left suspension members 51*a* and 51*b* are added up. These road-noise detection signals are input to the adder 12 of the controller 10 of FIG. 2, so as to add road-noise detection signals from the front and rear wheels.

Since signals related to road noises transmitted from the right and left wheels can be detected by means of a single vibration pickup 53, the road noises can not be only decreased in similar manner to that of the first preferred embodiment, but the number of noise source detecting means can also be decreased.

In this embodiment, the stabilizer 52 is used as the connecting member. Alternatively, a vibration pickup 53 can be mounted on a sub-frame for supporting thereon the suspension members, a cross member or so forth to obtain signals related to road noises transmitted from the right and left wheels and to obtain signals related to gear noises of the differential gear.

In the aforementioned embodiments, although the active noise control system is applied to a vehicle, it can be also applied to decrease engine noises within a passenger cabin of an airplane, and to decrease noises in a room which may be caused, for example, by operation of air conditioning equipment or such like, outside the room. In addition, although the aforementioned embodiments of the active noise control systems are applied to the case in that a plurality of noise sources are arranged outside a certain closed space, such as a vehicular compartment, it can be applied to the case in that the noise sources are arranged within the closed space. Furthermore, although a LMS algorithm in the aforementioned time-domain is used as an algorithm for renewing the filter factor of the adaptive digital filter in the aforementioned embodiments, other algorithms, such as a LMS algorithm in a frequency-domain, can be used for renewing the filter factor of the adaptive digital filter.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An active noise control system for decreasing noises transmitted to an observing position from a plurality of independent noise sources, said system comprising:

a plurality of noise source detecting means for monitoring physical quantities of individual noise sources to produce first signals indicative of the physical quantities of the noise sources;

signal collecting means for collecting said first signals to produce a second additive signal indicative of the sum of the first signals, said signal collecting means comprising time delay adjusting means for adjusting a time difference between reception of said respective first signals from said noise source detecting means to the signal collecting means in accordance with each respective propagation delay of said first signals at said observing position;

residual noise detecting means for monitoring a residual noise transmitted to the observing position to produce a third signal indicative of the residual noise;

sound source means, arranged at a location neighboring the observing position, for producing a control sound to cause the noise transmitted from the noise sources to interfere with the control sound so as to decrease the noise transmitted to the observing position; and control means for receiving said second and third signals to produce a fourth signal for deriving the sound source means on the basis of the second and third signals.

2. An active noise control system as set forth in claim 1, wherein said noise source detecting means are arranged at locations proximate individual noise sources.

3. An active noise control system for decreasing noises transmitted to an observing position from a plurality of independent noise sources as set forth in claim 1, wherein said control means includes an adaptive noise cancelling adaptor of a finite impulse response type which receives first signals passed through the signal collecting means weighted with respective weight coefficients, carries out adaptive noise cancelling filtering operation using filter coefficients and outputs the fourth signal.

4. An active noise control system for decreasing noises transmitted to an observing position from a plurality of independent noise sources, said system comprising:

a plurality of noise source detecting means for monitoring physical quantities of individual noise sources to produce first signals indicative of the physical quantities of the noise source;

signal collecting means for collecting said first signals to produce a second additive signal indicative of the sum of the first signals;

residual noise detecting means for monitoring a residual noise transmitted to the observing position, to produce a third signal indicative of the residual noise;

sound source means, arranged at a location neighboring the observing position, for producing a control sound to cause the noises transmitted from the noise sources to interfere with the control sound so as to decrease the noises transmitted to the observing position; and control means for receiving said second and third signals to produce a fourth signal for driving the sound source means on the basis of the second and third signals.

wherein said system is applied to an automotive vehicle;

wherein said noise source detecting means are mounted on the outer peripheries of tire wheels for detecting air pressures within tires to produce said first signals in accordance with the air pressures within the tires.

5. An active noise control system for decreasing noises transmitted to an observing position from a plurality of independent noise sources, said system comprising:

a plurality of noise source detecting means for monitoring physical quantities of individual noise sources to produce first signals indicative of the physical quantities of the noise source;

signal collecting means for collecting said first signals to produce a second additive signal indicative of the sum of the first signals;

residual noise detecting means for monitoring a residual noise transmitted to the observing position, to produce a third signal indicative of the residual noise;

sound source means, arranged at a location neighboring the observing position, for producing a control sound to cause the noises transmitted from the noise sources to interfere with the control sound so as to decrease the noises transmitted to the observing position; and control means for receiving said second and third signals to produce a fourth signal for driving the sound source means on the basis of the second and third signals, wherein said system is applied to an automotive vehicle;

wherein said noise source detecting means are mounted on members fixed to a vehicular body at locations behind door mirrors for detecting pressure fluctuations behind the door mirrors to produce said first signals in accordance with the pressure fluctuations behind the door mirrors.

6. An active noise control system for decreasing noises transmitted to an observing position from a plurality of independent noise sources, said system comprising:

a plurality of noise source detecting means for monitoring physical quantities of individual noise sources to produce first signals indicative of the physical quantities of the noise source;

signal collecting means for collecting said first signals to produce a second additive signal indicative of the sum of the first signals;

residual noise detecting means for monitoring a residual noise transmitted to the observing position, to produce a third signal indicative of the residual noise;

sound source means, arranged at a location neighboring the observing position, for producing a control sound to cause the noises transmitted from the noise sources to interfere with the control sound so as to decrease the noises transmitted to the observing position; and control means for receiving said second and third signals to produce a fourth signal for driving the sound source means on the basis of the second and third signals, wherein said system is applied to an automotive vehicle;

wherein said noise source detecting means are mounted on connecting members, one of which connects front-right and front-left suspension members to each other, and the other of which connects rear-right and rear-left suspension members, each of said noise detecting means detecting the sum of vibrations of right and left suspension wheels to produce said first signals in accordance with the sum of the vibrations thereof.

7. An active control system for decreasing noises transmitted to an observing position from a plurality of independent noise sources, said system comprising:

a plurality of noise source detecting means for monitoring physical quantities of individual noise sources to produce first signals indicative of the physical quantities of the noise source;

signal collecting means for collecting said first signals to produce a second signal indicative of the sum of the first signals;

delay circuit means interposed between the noise source detecting means and control means for applying delay times to the respective first signals so as to essentially equalize the time at which the first signals are transmitted to the signal collecting means said delay times being set individually independent from each other for respective sound sources;

residual noise detecting means for monitoring a residual noise transmitted to the observing position, to produce a third signal indicative of the residual noise;

sound source means, arranged at a location neighboring the observing position, for producing a control sound to cause the noises transmitted from the noise sources to interfere with the control sound so as to decrease the noises transmitted to the observing position; and control means for receiving said second and third signal to produce a fourth signal for driving the sound source means on the basis of the second and third signals.

8. An active noise sound control system for decreasing noises transmitted to an observing position from a plurality of noise sources applicable to a vehicular compartment, the system comprising:

a plurality of noise source detecting means for monitoring physical quantities of individual noise sources of the vehicle to produce first signals indicative of the physical quantities of the noise source;

signal collecting means for collecting said first signals to produce a second additive signal indicative of the sum of the first signals, said signal collecting means having time delay adjusting means for adjusting a time difference between reception of said respective first signals from said noise source detecting means to the signal collecting means with each propagation delay of said first signals at said observing position taken into consideration;

residual noise detecting means for monitoring a residual noise transmitted to the observing position, to produce a third signal indicative of the residual noise;

sound source means, arranged at a location neighboring the observing position, for producing a control sound to cause the noise transmitted from the noise sources to interfere with the control sound so as to decrease the noise transmitted to the observing position; and control means for receiving said second and third signals to produce a fourth signal for driving the sound source means on the basis of the second and third signals.

9. An active noise control system applied to an automotive vehicle for decreasing noises transmitted to an observing position from a plurality of independent noise sources, said system comprising:

a plurality of noise source detecting means for monitoring physical quantities of individual noise sources to produce first signals indicative of the physical quantities of the noise source;

signal collecting means for collecting said first signals to produce a second additive signal indicative of the sum of the first signals;

residual noise detecting means for monitoring a residual noise transmitted to the observing position, to produce a third signal indicative of the residual noise;

sound source means, arranged at a location neighboring the observing position, for producing a control sound to cause the noises transmitted from the noise sources to interfere with the control sound so as to decrease the noises transmitted to the observing position;

control means for receiving said second third signals to produce a fourth signal for driving the sound source means on the basis of the second and third signals, wherein said noise source detecting means are mounted on suspension members of the vehicle for detecting vibrations of the suspension members to produce said first signals in accordance with the vibrations thereof.

10. A system for actively cancelling noises derived from a plurality of sound sources having no correlation between each other applicable to a vehicle compartment, comprising:

a) a plurality of sensing means disposed on respective suspension members of the tire wheel portions for detecting and outputting respective road noise signals $X_1$ to $X_4$;

b) a plurality of loud speakers disposed in door panel inner portions at front right, front left, rear right, and rear left ends of the vehicular compartment so as to face against respective seat positions;

c) a plurality of microphones disposed on head rest positions of respective passenger's seats for detecting residual noise sounds and outputting residual noise detection signals $e_1$ to $e_8$; and d) a controller having an adder for receiving the road noise signals $X_1$ to $X_4$ derived from the respective sensing means and outputting a reference signal X as the added signal for the result of addition, a microprocessor receiving and processing the reference signal X and noise signals $e_1$ to $e_8$ from the respective microphones and outputting drive signals $Y_1$ to $Y_4$ according to an adaptive filtering process of the controller.

11. A system for actively cancelling noises derived from a plurality of sound sources having no correlation between each other applicable to a vehicular compartment as set forth in claim 10, wherein the controller includes a plurality of delay circuits interposed between the respective sensing means and adder for providing a time difference as a result of subtraction of predetermined delay times $\Delta t_1$ to $\Delta t_4$ from a maximum delay time $\Delta t$ max for remaining road noise signals $X_1$, $X_2$ and $X_4$ with one of the road noise signals having the maximum time delay $\Delta t$ max as the reference so that arrival times of controlled sounds from the loud speakers to a receiving point of inner space of the vehicular compartment which corresponds to positions of ear portions of a vehicular driver are coincident with each other.

12. A system for actively cancelling noises derived from a plurality of sound sources having no correlation between each other applicable to a vehicular compartment as set forth in claim 11, wherein said controller further includes an adaptive noise cancelling filter of a Finite Impulse Response type having individual filters according to the number of channels connected to the loud speakers which receive the reference signal X from the adder, carries out the adaptive noise filtering operations on the basis of currently set filter coefficients Wmi (m+1), and outputs the speaker drive signals $Y_1$ to $Y_4$.

13. A system for actively cancelling noises derived from a plurality of sound sources having no correlation between each other applicable to a vehicular compartment as set forth in claim 12, wherein said controller includes a digital filter which receives the reference signal X from the adder and produces a filtered reference signal $r_{1m}$ according to a number of transfer functions between the respective microphones and loud speakers and wherein said adaptive noise cancelling filter is functionally provided with a plurality of filters whose number corresponds to the number of output channels to the respective loud speakers for receiving the reference signal X, executing adaptive signal processing on the basis of filter coefficients set at the time of inputting the reference signal X, and outputting the drive signals $Y_1$ to $Y_4$ and the microprocessor functions to receive the filtered reference signal $r_{1m}$ and residual noise detection signals $e_1$ to $e_8$ and to modify the respective filter coefficients of the adaptive noise cancelling filter using a LMS algorithm.

14. A system for actively cancelling noises derived from a plurality of sound sources having no correlation between each other applicable to a vehicular compartment as set forth in claim 13, wherein the reference signal x(n) at a predetermined sampling period n derived from the adder is expressed as follows:

$$X(n) = \sum_{i=1}^{L} \beta_i X_i(n - N_i)$$

wherein, $\beta_i$ denotes a weight coefficient and $N_i$ denotes the predetermined delay times set for the respective delay circuits.

15. A system for actively cancelling noises derived from a plurality of sound sources having no correlation between each other applicable to a vehicular compartment as set forth in claim 14, wherein said digital filter calculates the filtered reference signal $r_{1m}$ correspondingly to the filter coefficients $C_{1m}$ which correspond to transfer functions between the microphones and speakers as follows:

$$r_{lm}(n - i) = \sum_{j=0}^{Ic-1} C_{lmj} \cdot X(n - j - i)$$

wherein, $C_{1mj}$ denotes the filter coefficient corresponding to j number (j=0, 1, 2, . . , $I_c-1$) of the transfer function (Finite Impulse Response function) between an m number of the loud speakers and an 1 number of microphones, and wherein said digital filter outputs the filtered reference signal $r_{lm}$ as the result of calculation to the microprocessor.

16. A system for actively cancelling noises derived from a plurality of sound sources having no correlation between each other applicable to a vehicular compartment as set forth in claim 15, wherein said microprocessor carries out an updating calculation of the filter coefficients on the basis of the following equation:

$$W_{mi}(n+1) = W_{mi}(n) + \alpha \cdot \sum_{l=1}^{L} \gamma_l \cdot e_l(n) \cdot r_{lm}(n-i)$$

wherein, $W_{mi}$ denotes the coefficient of the i number of the filter coefficients of the adaptive filter to derive the m number of the loud speakers, $\alpha$ denotes a converging coefficient of the adaptive filter, $r_l$ denotes a weight coefficient $e_l$ denotes the residual noise detection signal output from the 1 number of the microphones.

17. A system for actively cancelling noises derived from a plurality of sound sources having no correlation between each other applicable to a vehicular compartment as set forth in claim 16, wherein said adaptive filter derives the output values $y_m$ of the drive signals according to a vector calculation of the reference signal X and filter coefficients $W_{mi}$ as follows:

$$Y_m = \Sigma W_{mi} \cdot x(n-j-i).$$

* * * * *

UNITED STATES PATENT AND TRADEMARK OFFICE

CERTIFICATE OF CORRECTION

PATENT NO. : 5,245,664

DATED : September 14, 1993

INVENTOR(S) : Akio KINOSHITA, et al.

It is certified that error appears in the above-indentified patent and that said Letters Patent is hereby corrected as shown below:

On title page, item [75] should read as following:

--[75] Inventors: Akio Kinoshita; Hirofumi Aoki, both of Kanagawa, Japan--

Signed and Sealed this

Third Day of May, 1994

Attest:

BRUCE LEHMAN

*Attesting Officer*

*Commissioner of Patents and Trademarks*